(12) United States Patent
Rahhal-Orabi et al.

(10) Patent No.: US 11,205,707 B2
(45) Date of Patent: Dec. 21, 2021

(54) OPTIMIZING GATE PROFILE FOR PERFORMANCE AND GATE FILL

(71) Applicant: INTEL CORPORATION, Santa Clara, CA (US)

(72) Inventors: Nadia M. Rahhal-Orabi, Lake Oswego, OR (US); Tahir Ghani, Portland, OR (US); Willy Rachmady, Beaverton, OR (US); Matthew V. Metz, Portland, OR (US); Jack T. Kavalieros, Portland, OR (US); Gilbert Dewey, Hillsboro, OR (US); Anand S. Murthy, Portland, OR (US); Chandra S. Mohapatra, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 15/525,571

(22) PCT Filed: Dec. 22, 2014

(86) PCT No.: PCT/US2014/071978
§ 371 (c)(1),
(2) Date: May 9, 2017

(87) PCT Pub. No.: WO2016/105348
PCT Pub. Date: Jun. 30, 2016

(65) Prior Publication Data
US 2017/0330955 A1    Nov. 16, 2017

(51) Int. Cl.
*H01L 29/66* (2006.01)
*H01L 21/28* (2006.01)
(Continued)

(52) U.S. Cl.
CPC .. *H01L 29/66545* (2013.01); *H01L 21/28114* (2013.01); *H01L 29/42376* (2013.01); *H01L 29/66795* (2013.01); *H01L 29/785* (2013.01)

(58) Field of Classification Search
None
See application file for complete search history.

(56) References Cited

U.S. PATENT DOCUMENTS

| 6,656,808 B2 | 12/2003 | Kwean |
| 8,765,537 B2 | 7/2014 | Ng et al. |

(Continued)

FOREIGN PATENT DOCUMENTS

| CN | 103270597 | 8/2013 |
| TW | 200727415 A | 7/2007 |

(Continued)

OTHER PUBLICATIONS

International Preliminary Report on Patentability for PCT Patent Application No. PCT/US2014-071978 dated Jul. 6, 2017, 10 pgs.

(Continued)

*Primary Examiner* — Khaja Ahmad
(74) *Attorney, Agent, or Firm* — Schwabe, Williamson & Wyatt P.C.

(57) ABSTRACT

Systems and methods of optimizing a gate profile for performance and gate fill are disclosed. A semiconductor device having an optimized gate profile includes a semiconductor substrate and a fin extending above the semiconductor substrate. A pair of source and drain regions are disposed on opposite sides of a channel region. A gate stack is disposed over the channel region, where the gate stack includes a top portion separated from a bottom portion by a tapered portion. The top portion and at least a portion of the tapered portion are disposed above the fin.

17 Claims, 7 Drawing Sheets

(51) Int. Cl.
*H01L 29/423* (2006.01)
*H01L 29/78* (2006.01)

(56) References Cited

U.S. PATENT DOCUMENTS

| | | | |
|---|---|---|---|
| 2005/0275015 A1 | 12/2005 | Anderson et al. | |
| 2006/0017099 A1* | 1/2006 | Paik | H01L 29/66621 257/330 |
| 2006/0189043 A1 | 8/2006 | Schulz | |
| 2009/0206406 A1* | 8/2009 | Rachmady | H01L 21/28114 257/365 |
| 2010/0151649 A1* | 6/2010 | Suk | H01L 29/785 438/303 |
| 2010/0197094 A1 | 8/2010 | Kim et al. | |
| 2011/0147812 A1 | 6/2011 | Steigerwald et al. | |
| 2013/0178055 A1 | 7/2013 | Labonte | |
| 2013/0270559 A1 | 10/2013 | Hafez et al. | |
| 2014/0170842 A1 | 6/2014 | Noro et al. | |
| 2014/0183599 A1* | 7/2014 | Hong | H01L 29/785 257/190 |
| 2015/0001468 A1* | 1/2015 | Huang | H01L 29/66977 257/24 |
| 2015/0187946 A1* | 7/2015 | Park | H01L 29/66795 257/368 |
| 2015/0263136 A1* | 9/2015 | Hsiao | H01L 21/28114 257/401 |
| 2016/0093537 A1* | 3/2016 | Chen | H01L 21/823481 438/283 |
| 2016/0111531 A1* | 4/2016 | Dong | H01L 29/0653 257/347 |
| 2016/0172445 A1* | 6/2016 | Kim | H01L 29/7853 257/401 |
| 2016/0204109 A1* | 7/2016 | Kim | H01L 29/78 257/369 |
| 2017/0098711 A1* | 4/2017 | Hsiao | H01L 21/30604 |

FOREIGN PATENT DOCUMENTS

| | | |
|---|---|---|
| TW | 201320331 A | 5/2013 |
| TW | 201342486 A | 10/2013 |

OTHER PUBLICATIONS

International Searching Authority at the Korean Intellectual Property Office, International Search Report and Written Opinion for International Patent Application No. PCT/US2014/071978, dated Sep. 17, 2015, 11 pages.
Search Report for European Patent Application No. 14909206.6 dated Jul. 25, 2018, 8 pages.
Office Action for Taiwan Patent Application No. 104138327, dated Jun. 11, 2019, 16 pgs.
Office Action for Taiwan Patent Application No. 104138327, dated Mar. 26, 2020 2 pgs.
Office Action for Chinese Patent Application No. 201480083561.0, dated Feb. 6, 2020 10 pgs.
Notice of Allowance from Taiwan Patent Application No. 104138327, dated Oct. 16, 2020, 3 pgs.
Office Action for Chinese Patent Application No. 201480083561.0, dated Aug. 19, 2020 8 pgs., no translation.
Office Action for European Patent Application No. 14909206.6 dated Sep. 2, 2020, 5 pages.
Office Action for Korean Patent Application No. 10-2017-7013492, dated Nov. 23, 2020 9 pgs.
Office Action for Chinese Patent Application No. 201480083561.0, dated Dec. 30, 2020, 8 pgs.
Office Action for Chinese Patent Application No. 201480083561.0, dated Jul. 27, 2021, 6 pgs.
Office Action for Korean Patent Application No. 10-2017-7013492, dated Apr. 30, 2021, 5 pgs.
Notice of Allowance for Korean Patent Application No. 10-2017-7013492, dated Jun. 24, 2021, 2 pgs.

* cited by examiner

OPTIMIZING GATE PROFILE FOR PERFORMANCE AND GATE FILL

CROSS-REFERENCE TO RELATED APPLICATION

This patent application is a U.S. National Phase Application under 35 U.S.C. § 371 International Application No. PCT/US2014/071978, filed Dec. 22, 2014, entitled OPTIMIZING GATE PROFILE FOR PERFORMANCE AND GATE FILL.

TECHNICAL FIELD

Embodiments generally relate to semiconductor processes and, more specifically, optimizing gate profiles for increased performance and metal gate fill of semiconductor devices.

BACKGROUND

Performance of a semiconductor chip is highly dependent upon the number of transistor devices fabricated on the semiconductor chip. For example, the performance of a central processing unit increases as the number of its logic devices increases. Strictly increasing the number of transistor devices, however, increases the amount of real estate occupied by the transistor devices, which results in a detrimental increase in the overall size of the chip. Thus, to maximize the number of transistor devices formed on the chip, industry leaders have sought ways to shrink the size of each transistor device. Shrinking transistor device size allows an increased number of transistor devices to be formed on a single semiconductor chip without significantly increasing the overall size of the chip. Techniques for minimizing transistor device size include decreasing the size of a gate stack for transistor devices. Decreasing the size of the gate stack allows other transistor device components to relatively decrease in size, thereby yielding a smaller device.

BRIEF DESCRIPTION OF THE DRAWINGS

FIG. 3D-1 illustrates an isometric view of a method of forming a sacrificial gate structure with a fill-friendly profile, in accordance with an embodiment of the invention.

FIG. 3D-2 illustrates a cross-sectional view of a sacrificial gate structure in the foreground relative to a fin in the background, in accordance with an embodiment of the invention.

DETAILED DESCRIPTION

Described herein are systems and methods of forming a gate stack by using a sacrificial gate structure having a fill-friendly profile. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Figure 1:
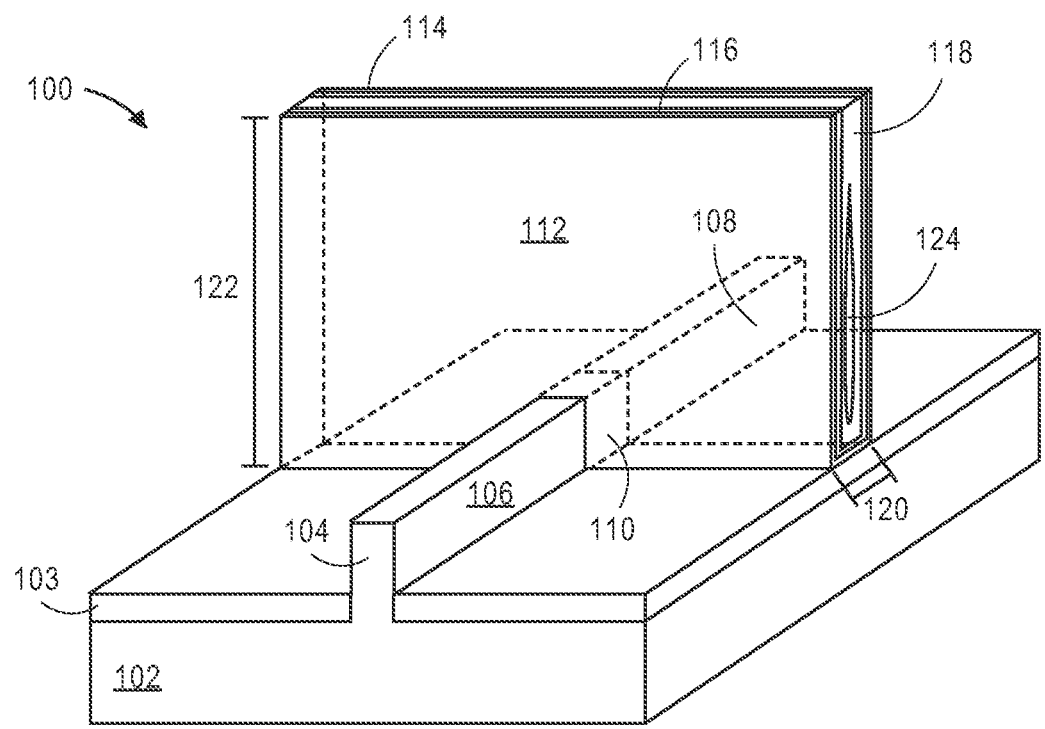
FIG. 1 illustrates an isometric view of a conventional gate stack for a non-planar finFET device.

Currently, a conventional gate stack for a semiconductor device is formed to have one uniform thickness along its entire height. FIG. 1 illustrates a non-planar device with an exemplary conventional gate stack 112. The non-planar device may be a finFET 100, such as a tri-gate field effect transistor, which includes a semiconductor substrate 102 and a fin 104 formed above the semiconductor substrate 102. The fin 104 may be part of the substrate 102 such that the fin 104 and substrate 102 form one monolithic structure. A shallow trench isolation (STI) 103 may be formed on the substrate 102 and around the fin 104. The fin 104 may extend above the STI 103. A gate stack 112, which may include a gate electrode formed of a workfunction metal layer 116 and a fill metal layer 118, may be formed over a channel region 110 of the fin 104. The gate stack 112 may also include a gate dielectric 114 disposed between the channel region 110 and the workfunction metal layer 116. A pair of source and drain regions 106/108 may be formed within the fin 104 and on opposite sides of the channel region 110.

As illustrated in FIG. 1, the conventional gate stack 112 has a width 120 that is uniform along its entire height 122. The width 120 at the bottom of the gate electrode 112 may also be known as the "gate length," which may represent the distance between the source and drain regions 106/108. In an embodiment, the gate stack 112 has a large aspect ratio. A structure with a large aspect ratio has a height that is substantially larger than its width. For instance, the gate height 122 may be substantially larger than the gate length 120. In an embodiment, the gate stack 112 of the finFET device 100 has an aspect ratio of at least 5 to 1.

Typically, the gate stack 112 may be formed by a replacement gate process. The replacement gate process may initially involve formation of a sacrificial gate structure over a semiconductor structure, such as the fin 104. Thereafter, an isolation layer may be formed around the sacrificial gate structure, and the sacrificial gate structure may then be removed to form an opening in the isolation layer. The opening may have a profile that corresponds to the profile of the sacrificial gate structure. A gate dielectric and gate electrode material, such as gate dielectric 114 and workfunction metal 116 and fill metal 118, may then be deposited into the opening to form the gate stack 112. The opening may have a large aspect ratio that is difficult to fill due to its small width and deep, vertical cavity. Such an opening has a higher likelihood of pinching off when depositing materials within it. Pinch-off is an occurrence where deposited material accumulates near the opening of a trench, to a point where the opening prematurely seals during deposition and forms a void within the trench. Accordingly, the gate stack 112 may have a void 124. The void 124 reduces device performance and may cause the device to fail.

Embodiments of the present invention disclosed herein substantially reduce, if not eliminate, the formation of voids within the gate stack by utilizing a trench with an opening having a fill-friendly gate profile. According to an embodiment of the present invention, a method of forming a semiconductor device includes forming a sacrificial gate structure having a fill-friendly profile over a semiconductor structure, such as a fin. According to an embodiment of the invention, the fill-friendly sacrificial gate structure includes a top portion and a bottom portion separated by a tapered portion. The top portion may be wider than the bottom portion, and the tapered portion may transition the width from the wider top portion to the narrower bottom portion. The fill-friendly sacrificial gate structure may be formed by depositing a sacrificial gate material, such as a polycrystalline material, and subsequently etching it with an etch process containing two etching operations. A first etching operation may initially etch a top portion of the sacrificial gate structure, and a second etching operation may subsequently etch both a tapered portion and a bottom portion of the sacrificial gate structure.

The method may further include forming an isolation layer around the sacrificial gate structure having a fill-friendly profile, and subsequently removing the sacrificial gate structure to form an opening in the isolation layer. The opening may be a fill-friendly opening having a profile that corresponds to the fill-friendly profile of the sacrificial gate structure. For instance, in an embodiment, the fill-friendly opening may have a wide top portion, a narrow bottom portion, and a tapered portion between the top and bottom portions. Gate material may then be deposited into the opening to form a gate electrode.

Having a fill-friendly opening allows gate material be easily deposited into the opening, minimizing pinch-off and void formation. Minimizing pinch-off and void formation increases production yield. Additionally, the fill friendly opening formed during the replacement gate process allows formation of transistor devices with smaller gate lengths. Devices with smaller gate lengths increases the transistor density of a semiconductor chip, which may thereby increase device performance.

Figure 2:
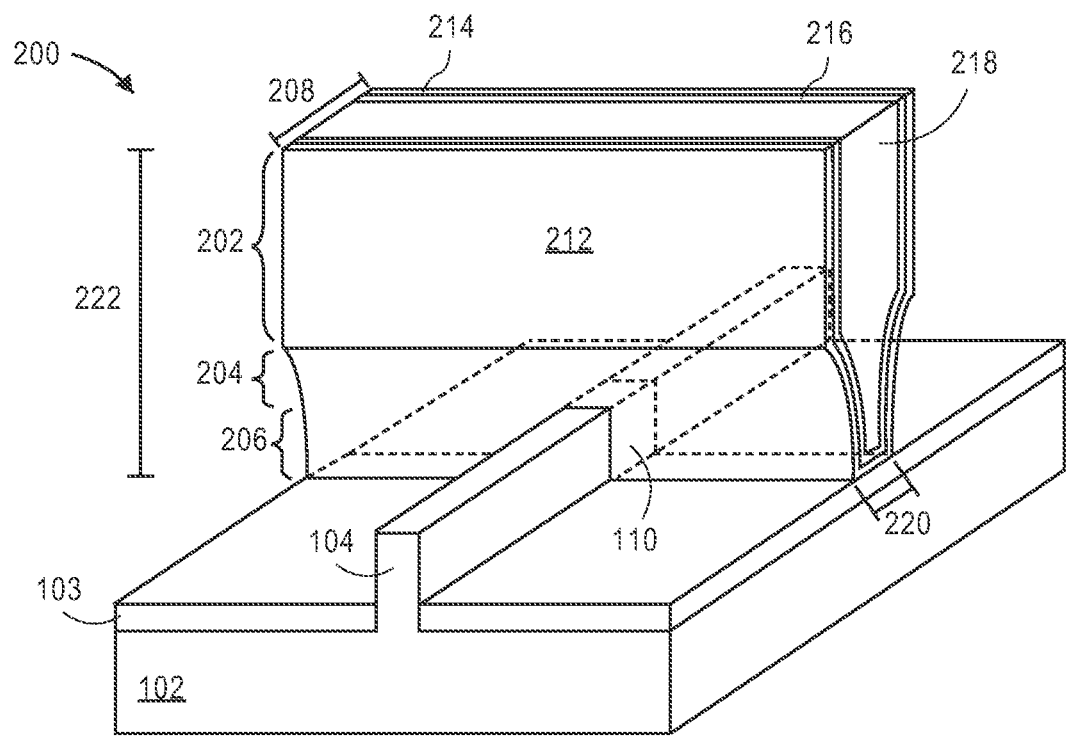
FIG. 2 illustrates an isometric view of a gate stack with a fill-friendly profile for a non-planar finFET device, in accordance with an embodiment of the invention.

FIG. 2 illustrates a gate stack 212 having a fill-friendly profile, according to an embodiment of the present invention. The gate stack 212 has a wide top portion 202, a tapered portion 204, and a narrow bottom portion 206. In an embodiment, the top portion 202 is wider than the bottom portion 206. For instance, the top portion 202 may have a width 208 that is at least two times greater than the bottommost width 220 (e.g., gate length) of the bottom portion 206. The top portion 202 and bottom portion 206 may have substantially constant widths across their respective entire heights.

In an embodiment, the gate stack 212 has a large aspect ratio. That is, the height 222 of the gate stack 212 may be substantially greater than the narrowest region of the gate stack 212, which may be the gate length 220. The height 222 may be measured by the distance from the top of the STI 103 to the top of the gate stack 212, and the width may be measured by the diameter of the opening of the smallest width, such as the bottommost width 220 of the bottom portion 206. In an embodiment, the gate stack 212 may have an aspect ratio of at least 5 to 1. In an embodiment, the gate stack 212 has an aspect ratio of around 10 to 1. In a particular embodiment, the height 222 and the gate length 220 may be approximately 200 nm and 20 nm, respectively. The height 222 of the gate stack 212 may be the distance from the top of the STI 103 to the top of the gate stack 212. The gate stack 212, which may include a gate electrode formed of a workfunction metal layer 216 and a fill metal layer 218, may be formed over a channel region 110 of the fin 104. The gate stack 212 may also include a gate dielectric 214 disposed between the channel region 110 and the workfunction metal layer 216. The gate stack 212 may also include a gate dielectric 214 disposed between the channel region 110 and the workfunction metal layer 216.

In embodiments, the profile of the gate stack 212 is different from the gate stack 112. For instance, the gate stack 212 may have a fill-friendly profile, and the gate stack 112 may not. The difference in gate profiles may be created by a method that utilizes a sacrificial gate structure with a fill-friendly profile. The sacrificial gate structure may be used to form a fill-friendly opening within which the gate stack 212 may be formed. The fill-friendly opening minimizes formation of voids 124 within the gate stack 212, which may contribute to increased device performance and may maximize production yield. In embodiments, the gate stack 212 does not have a void 124 formed within it.

Figure 3A:
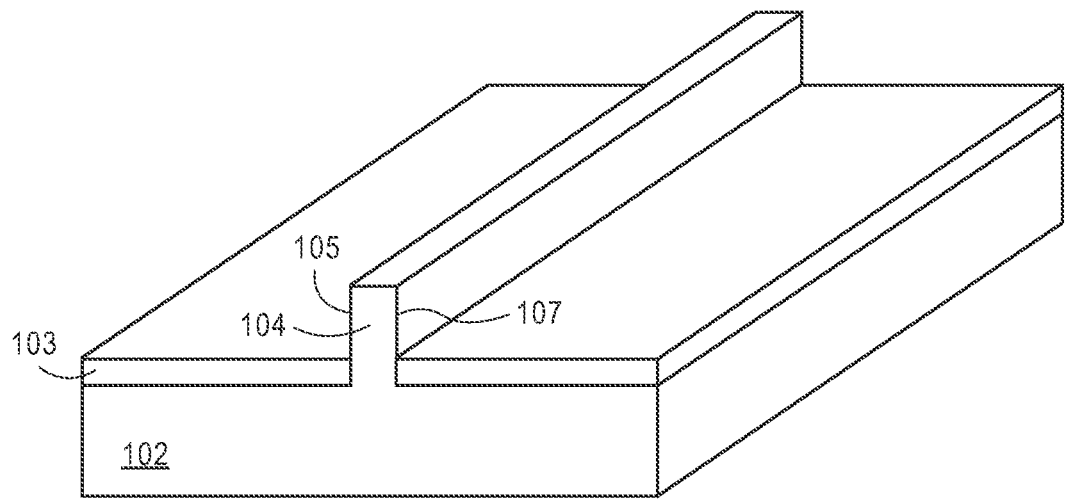
FIGS. 3A-3C illustrate isometric views of a method of forming a patterned mask on a sacrificial gate material, in accordance with an embodiment of the invention.

An exemplary method of forming the gate stack 212 is illustrated in FIGS. 3A-3H. As shown in FIG. 3A, a fin 104 is formed in a substrate 102. The substrate 102 may be any suitable substrate upon which semiconductor devices may form. In an embodiment, the substrate 102 is a semiconductor substrate, such as a bulk silicon semiconductor substrate. Alternatively, in an embodiment, the semiconductor substrate may be a crystalline substrate formed using a silicon-on-insulator (SOI) substructure. In an alternative embodiment, the substrate 102 is a heterojunction substrate containing more than one layer of substrate material. In other embodiments, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate 102 may be formed are described here, any material that may serve as a foundation upon which a semiconductor device may be built falls within the spirit and scope of the present invention.

The fin 104 may be formed in the substrate 102 by an anisotropic etch process. For instance, the fin 104 may be formed by patterning a mask over a portion of the semiconductor substrate, and then anisotropically etching exposed regions of the substrate 102. The anisotropic etch process may form the fin 104 with vertical sidewalls 105 and 107. The fin 104 may be used as a transistor body for a subsequently formed transistor device, as will be discussed further herein.

As further illustrated in FIG. 3A, a STI 103 is formed on the substrate 102. In an embodiment, the STI 103 may be formed after the fin 104. The STI 103 may be formed by an initial deposition process, followed by a planarization process and a recess etch. For instance, any suitable deposition process, such as chemical vapor deposition (CVD), may initially blanket deposit insulating material on the substrate 102 and the fin 104. The subsequent planarization process, such as chemical-mechanical planarization (CMP), may then planarize the deposited insulating material to the top of the fin. The recess etch process may then recess the STI to below the fin height. The depth of the recess may be determined based upon a target fin height according to design requirements. A greater recess may yield a larger the fin 104 height. Accordingly, the fin 104 may extend above the STI 103 so that it is exposed for forming a body upon which a transistor may form. The STI 103 may electrically isolate the substrate 102 from subsequently formed semiconductor structures disposed above the STI 103.

Figure 3B:
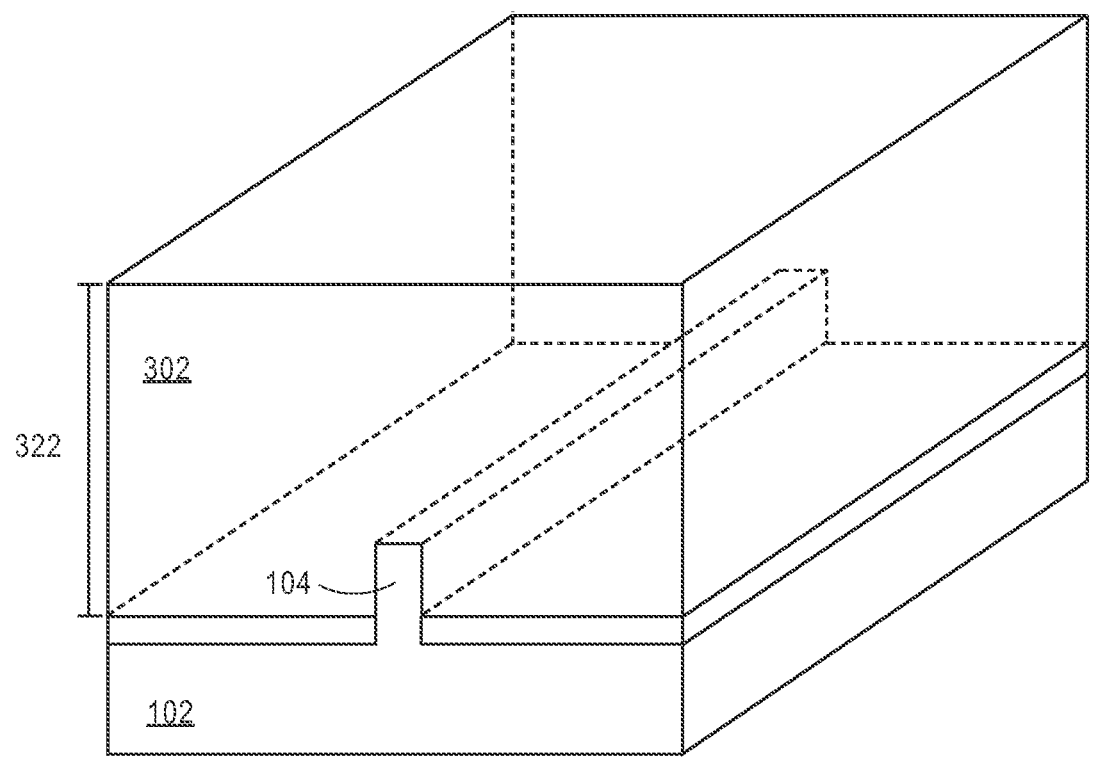

Thereafter, in FIG. 3B, a sacrificial gate material 302 is formed over the fin 104 and the STI 103. The sacrificial gate material 302 may be formed by a deposition and planarization process, such as a CVD and CMP process. The sacrificial gate material 302 may be planarized to a height 322 that corresponds to at least the height 222 of the gate stack 212 as aforementioned herein with respect to FIG. 2. For instance, the height 322 may be at least approximately 200 nm. In an embodiment, the sacrificial gate material 302 may be formed of a polycrystalline material, such as polysilicon. In an embodiment, the sacrificial gate material 302 is planarized to a height 322 that is substantially greater than the height 222. In one such embodiment, the height 322 of the sacrificial gate material 302 is targeted to accommodate a subsequent replacement gate process that may involve recessing the height 322 during a polishing process, as is described in greater detail below. In an exemplary embodiment, the height 322 of the sacrificial gate material 302 is approximately 1.5-2 times greater than the ultimately targeted height 222 of the gate stack 212.

Figure 3C:
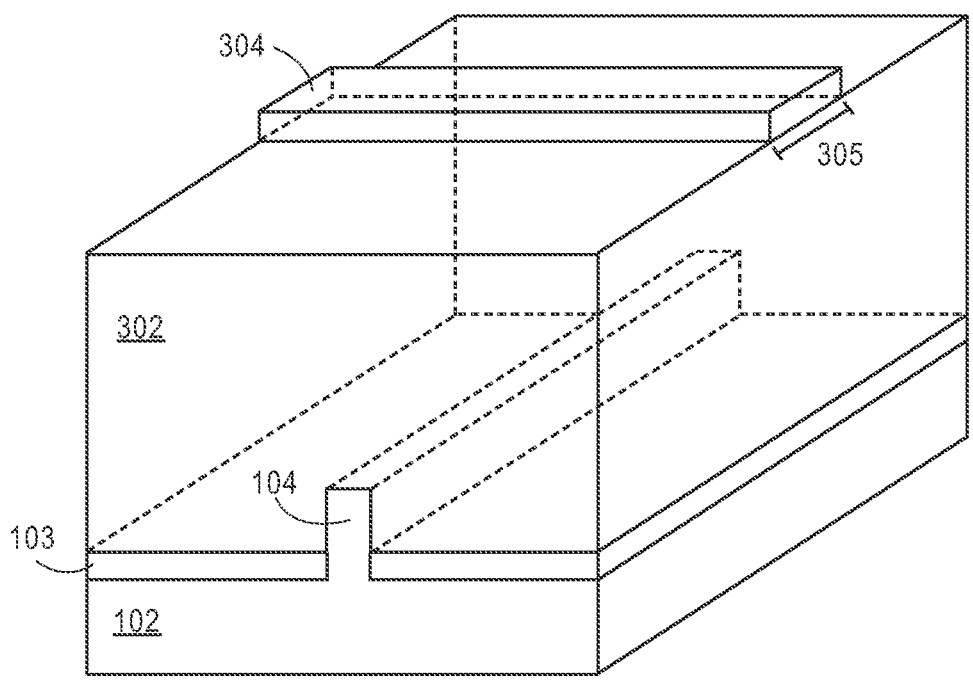

Next, in FIG. 3C, a patterning mask 304 is formed on a portion of the sacrificial gate material 302. The patterning mask 304 may be formed by a patterning and etching technique. For instance, the patterning mask 304 may be formed by spinning on a photoresist and subsequently patterning the photoresist by an exposure and develop process. In an embodiment, the photoresist is used in a subsequent etching process to pattern an underlying hard mask. The hard mask may then be used as the patterning mask 304. In an alternative embodiment, the photoresist itself is used as the patterning mask 304. The patterning mask 304 may cover a portion of the sacrificial gate material 302 where a sacrificial gate structure is to be formed. The patterning mask 304 may also define a channel region of the fin 104. In embodiments, the patterning mask 304 is formed along a direction perpendicular to the fin 104. The patterning mask 304 may have a width 305 that substantially corresponds to a width of a subsequently formed gate stack, such as the width 208 of the top portion 202 of the gate stack 212, as discussed herein with respect to FIG. 2.

Figures 1, 3D:
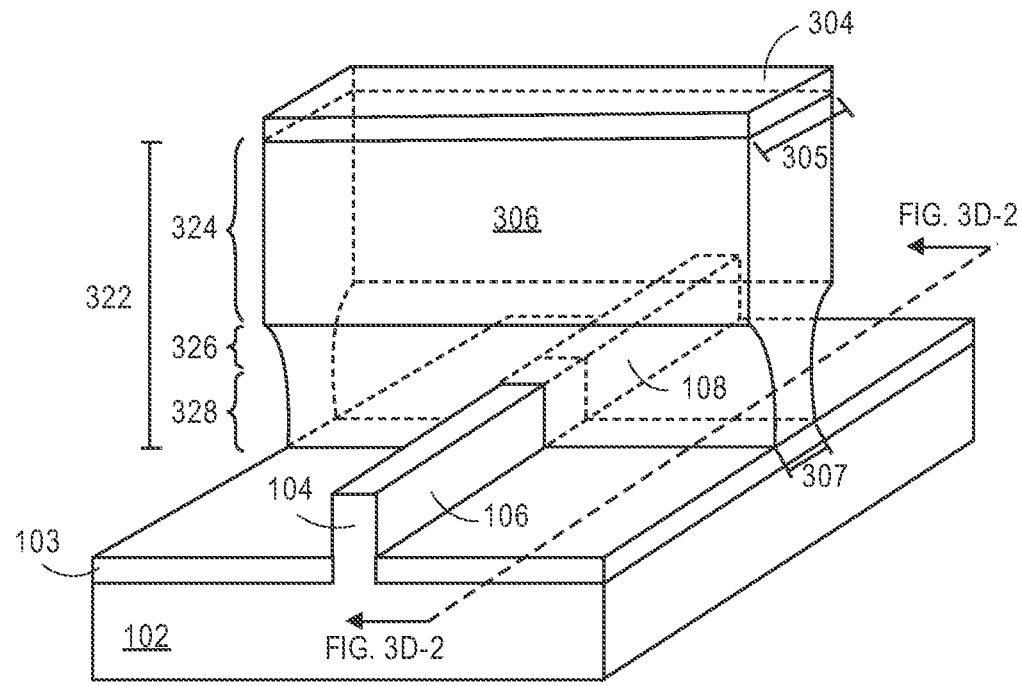
Figures 2, 3D:
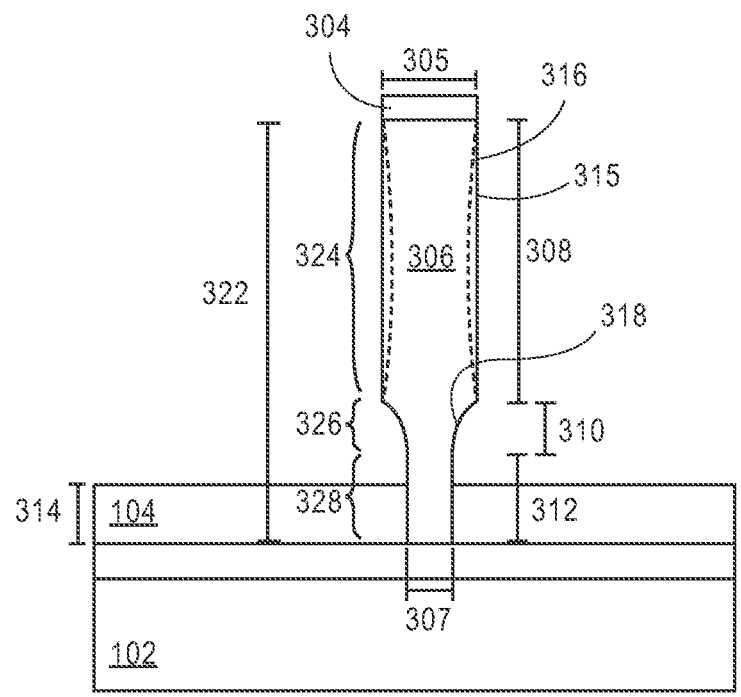

Once the patterning mask 304 is formed, a sacrificial gate structure 306 is formed from the sacrificial gate material 302 as illustrated in FIG. 3D-1. The sacrificial gate structure 306 may include a top portion 324 and a bottom portion 328. A tapered portion may be disposed between the top and bottom portions 324 and 328. In an embodiment, the width 305 of the top portion 324 may be greater than the width 307 of the bottom portion 328. A more detailed perspective of the sacrificial gate profile is illustrated in the cross-sectional view of FIG. 3D-1 shown in FIG. 3D-2. Specifically, FIG. 3D-2 illustrates a cross-sectional view of FIG. 3D-1 across the length of the sacrificial gate structure 306 (along the length of the fin 104) at a plane beside the fin 104. The view is from the perspective observed toward the fin 104 so that the fin 104 is shown in the background while the cross-section of the sacrificial gate structure 306 is shown in the foreground. Accordingly, the structural profile of the sacrificial gate structure 306 may be shown relative to the fin 104. It is to be appreciated that the word "profile" used herein refers to the cross-sectional profile of the structure when cut in the direction that is along the length of the fin 104.

With reference to FIG. 3D-2, the width 305 of the top portion 324 may be larger than the width 307 of the bottom portion 328. For instance, the width 305 of the top portion 324 may be at least twice as wide as the width 307. In an embodiment, the width 307 ranges between 18 to 22 nm when the width 305 ranges between 36 to 44 nm. In a particular embodiment, the width 305 is approximately 40 nm when the width 307 of the bottom portion 328 is approximately 20 nm. The wider top portion 328 substantially decreases chances of pinch-off, and thus the formation of voids 124, during formation of the gate stack, as will be discussed further herein.

The width 307 of the bottom portion 328 may define the gate length of the transistor device. For instance, if the width 307 is approximately 20 nm, the gate length of the transistor device may be approximately 20 nm. In embodiments, the width 307 may be established according to design requirements.

Both the top and bottom portions 324 and 328 may each have substantially constant widths across their entire vertical lengths. For instance, the top portion 324 may have a substantially constant width 305 across its entire vertical length 308, and the bottom portion 328 may also have a substantially constant width 307 across its entire vertical length 312. Accordingly, both the top and bottom portions 324 and 328 may have substantially vertical sidewalls.

A tapered portion 326 may be located between the top and bottom portions 324 and 328. The tapered portion 326 may have a vertical height 310. In embodiments, the tapered portion 326 has curved sidewalls 318. The curved sidewalls 318 may have concave profiles that mirror one another across the center of the sacrificial gate structure 306. The tapered portion 326 may have a gradually reducing width that is wider at the top and narrower at the bottom. In an embodiment, the top of the tapered portion 326 has the same width 305 as the top portion 324, and the bottom of the tapered portion 326 has the same width 307 as the bottom portion 328. For instance, in an embodiment where the width of the top and bottom portions 324 and 328 are 40 and 20 nm, respectively, the top and bottom widths of the tapered portion 326 is 40 and 20 nm, respectively. The concave profile of the tapered portion 326 may allow easier filling of a bottom portion of an opening during formation of a gate stack, as will be discussed further herein with respect to FIG. 3G.

According to embodiments of the invention, the vertical lengths 308, 310, and 312 may vary in magnitudes. In an embodiment, the vertical length 312 of the bottom portion 328 is greater than the height 314 of the fin 104. For instance, the vertical length 312 of the bottom portion 328 may be at least 20 nm greater than the height 314 of the fin 104. In an embodiment where the height 314 of the fin 104 is approximately 40 nm, the vertical length 312 of the bottom portion 328 is approximately 60 nm. Accordingly, the top portion 324 and the tapered portion 326 of the sacrificial gate structure 306 may be disposed above the fin 104. In an embodiment, the top of the tapered portion 326 is above the top of the fin 104 such that the bottom portion 328 has a vertical length 312 greater than the height 314 of the fin 104. In one embodiment, the top of the tapered portion 326 may be at around the midpoint of the height 322 of the sacrificial gate structure 306. Alternatively, the top of the tapered portion 326 may be below the midpoint of the height 322 of the sacrificial gate structure 306, but at a distance from the top of the STI 103 so that the vertical length 312 of the bottom portion 328 is greater than the height 314 of the fin 104. Having the tapered portion 326 above the fin 104 ensures that the width 307 is the same across all surfaces of the fin 104 due to the substantially constant width 307 across the entire vertical length 312 of the bottom portion 328. Accordingly, the gate length may be substantially equal across all surfaces of the fin 104. However, in other embodiments, only a portion of the tapered portion 326 need be above the fin 104. Thus, at least a portion of the tapered portion 326 is above the fin 104.

The vertical length 310 of the tapered portion 326 may be any suitable magnitude sufficient to produce a substantially curved sidewall 318. For instance, the vertical length 310 may be between 15 to 25 nm. In an embodiment, the vertical length 310 is approximately 20 nm. A substantially curved sidewall 318 has a gradual change in width that allows a material to deposit within a subsequently-formed cavity without pinching off and forming a void. Accordingly, the gradual change in width makes it easier to deposit gate material during subsequent filling of the bottom portion 328, as will be discussed further herein.

The vertical length 308 of the top portion 324 may be determined by the remaining distance between the height 322 of the sacrificial gate structure 306 and the sum of the vertical lengths 310 and 312 of the tapered portion 326 and bottom portion 328, respectively. For instance, in an embodiment where the height 322 is 200 nm and the sum of the vertical lengths 310 (e.g., 20 nm) and 312 (e.g., 40 nm) is 60 nm, the vertical length 308 of the top portion 324 may be approximately 120 nm. However, the vertical length 308 of the top portion 324 may not be less than half of the total height 322. Having a vertical length 308 greater than half the total height 322 maintains the fill-friendliness of the sacrificial gate structure profile. For instance, if the vertical length 308 of the top portion 324 is less than half the distance of the total height 322, then the bottom portion 328 may be too tall, thereby creating a greater possibility of pinch-off during formation of a gate stack, as will be discussed further herein.

In an embodiment, the top portion 324 may have an eroded sidewall profile 316. The eroded sidewall profile 316 may be a sidewall profile that is slightly recessed from the initial position of the sidewall 315 created during the first processing operation. The eroded sidewall profile 316 may be caused by further exposure to an etching environment during the second processing operation. Thus, in some embodiments, the sidewalls 315 of the top portion 324 may not be substantially vertical, but may have a slightly concave profile. In an embodiment, the eroded sidewall 316 is recessed from the initial position of the sidewall 315 by around 1 to 10 nm. In a particular embodiment, the eroded sidewall 316 is recessed by approximately 5 nm from its initial position at its most recessed point.

The height 322 of the sacrificial gate structure 306 may be established according to design requirements. For instance, in an embodiment where the gate stack is designed to have an aspect ratio of 10 to 1, the height 322 of the sacrificial gate structure 306 may be approximately ten times the width 307 of the bottom portion 328. For example, if the width 307 is around 20 nm, the height 322 may be approximately 200 nm. In embodiments, the height 322 of the sacrificial gate structure 306 may include the vertical length 308 of the top portion 324, the vertical length 310 of the tapered portion 326, and the vertical length 312 of the bottom portion 328. In an embodiment, the height 322 ranges between 180 to 220 nm. The tall height 322 allows the sacrificial gate structure 306 to resist erosion from subsequent processing operations.

According to an embodiment of the present invention, the sacrificial gate structure 306 is formed by etching the sacrificial gate material 302 with an etch process, e.g., a plasma etch process, containing two process operations: a first process operation and a second process operation. The two process operations may be performed sequentially within the same processing chamber. A careful optimization of the relative anisotropy of the process operations by changing the reactant gas concentration and the processing temperature of the two processing operations may lead to the fill-friendly profile of the sacrificial gate structure 306 as shown in FIG. 3D-1.

In an example, the first process operation may act as a main etch operation, and the second process operation may act as a finishing etch and over-etch operation. Accordingly, the first and second processing operations may include a first and second processing environment, respectively. In an embodiment, the first and second processing environments each include a reactant gas concentration and a processing temperature. The etching gas may be any suitable gas capable of etching the sacrificial gate material 302. For instance, if the sacrificial gate material is formed of polysilicon, the etching gas may be chlorine. According to an embodiment of the invention, the first processing environment includes a higher reactant gas concentration and a higher processing temperature than that of the second processing environment. In a particular embodiment, the first processing environment includes a total etchant gas flow of inert and reactant gases of approximately 1800 sccm for a processing volume suitable for processing of 300 mm wafers. Of the approximately 1800 sccm total gas flow of the first processing environment, approximately 50 to 70 sccm is reactant chlorine gas. In an embodiment, a processing temperature approximately in the range of 65° C. to 75° C. is used for the first processing environment. The second processing environment also includes a total etchant gas flow of inert and reactant gases of approximately 1800 sccm for a processing volume suitable for processing of 300 mm wafers. However, of the approximately 1800 sccm total gas flow of the second processing environment, approximately 20-40 sccm is reactant chlorine gas. In an embodiment, a processing temperature approximately in the range of 50° C. to 60° C. is used for the second processing environment. Thus, in an embodiment, tunability between the first and second etch operations is achieved by altering chlorine concentration and processing temperature.

The first process operation may form a top portion 324 of the sacrificial gate structure 306. In particular, the first etch process operation may be implemented to etch the sacrificial gate material 302 to approximately the level where the inflection point between portions 324 and 326 will ultimately be formed in the sacrificial gate structure. In an embodiment, the second process operation is performed immediately after the first process operation. The second process operation can be implemented in order to complete etching of the sacrificial gate material 302 down to the surface of the fin 104 or the STI 103 (depending on location of the sacrificial material 302). Furthermore, the second process operation undercuts the region 324 to form regions 326 and 328 of the sacrificial gate structure. Accordingly, the second process environment may be created in the process chamber immediately after the first process operation is performed. The second process environment may create an over-etch of the sacrificial gate structure 306, thus forming a tapered portion 326 and a bottom portion 328. Constant exposure to the second process environment causes the width 305 of the top portion 324 to gradually narrow to a width 307 of the bottom portion 328. For instance, the immediate change in processing environment may gradually narrow the sacrificial gate structure 306 (which may define the tapered portion 326) until it reaches the over-etch target depth (which may define the width 307 of the bottom portion 328). Accordingly, the width 307 of the bottom portion 328 may be smaller than the width 305 of the top portion 324. In embodiments, the width 307 of the bottom portion 328 may be at least two times smaller than the width 305 of the top portion 324. Both the top and bottom portions 324 and 328 may have constant widths 305 and 307, respectively, across their entire heights. In an embodiment, the gradual thinning of the sacrificial gate structure 306 within the tapering portion 326 caused by the second process environment forms a curved, concave profile. The dimensions of the top, bottom, and tapered portions 324, 328, and 326 of the sacrificial gate structure 306 may correspond with the top, bottom, and tapered portions 202, 206, and 204 of the gate stack 212, respectively, as described herein with respect to FIG. 2.

Once the sacrificial gate structure 306 is formed, in an embodiment, a pair of sidewall spacers (not shown) may be formed around the sacrificial gate structure 306. The pair of gate spacers may act as an implant mask during implantation of the source and drain regions 106 and 108. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations.

Source and drain regions 106 and 108 may then be formed on opposite sides of the sacrificial gate structure 306, as previously shown in FIG. 3D-1. In an embodiment, source and drain regions 106 and 108 are formed within the fin 104 by an implantation/diffusion process. Dopants such as boron, aluminum, antimony, phosphorous, or arsenic may be ion-implanted into the substrate to form the source and drain regions 106 and 108. An annealing process that activates the dopants and causes them to diffuse further into the fin 104 may follow the ion implantation process. In alternative embodiments, instead of forming implanted source and drain regions 106 and 108, source and drain structures (not shown) may be formed on exposed surfaces of the fin 104 instead, which may be recessed regions of the fin 104. The source and drain structures may be formed by an epitaxial deposition process. In some implementations, the source and drain structures may be fabricated using a silicon alloy such as silicon germanium or silicon carbide in order to stress the channel region. In some implementations the epitaxially deposited silicon alloy may be doped in situ with dopants such as boron, arsenic, or phosphorous. In further embodiments, the source and drain structures may be formed using one or more alternate semiconductor materials such as germanium or a group III-V material or alloy. In further embodiments, one or more layers of metal and/or metal alloys may be used to form the source and drain structures.

Figure 3E:
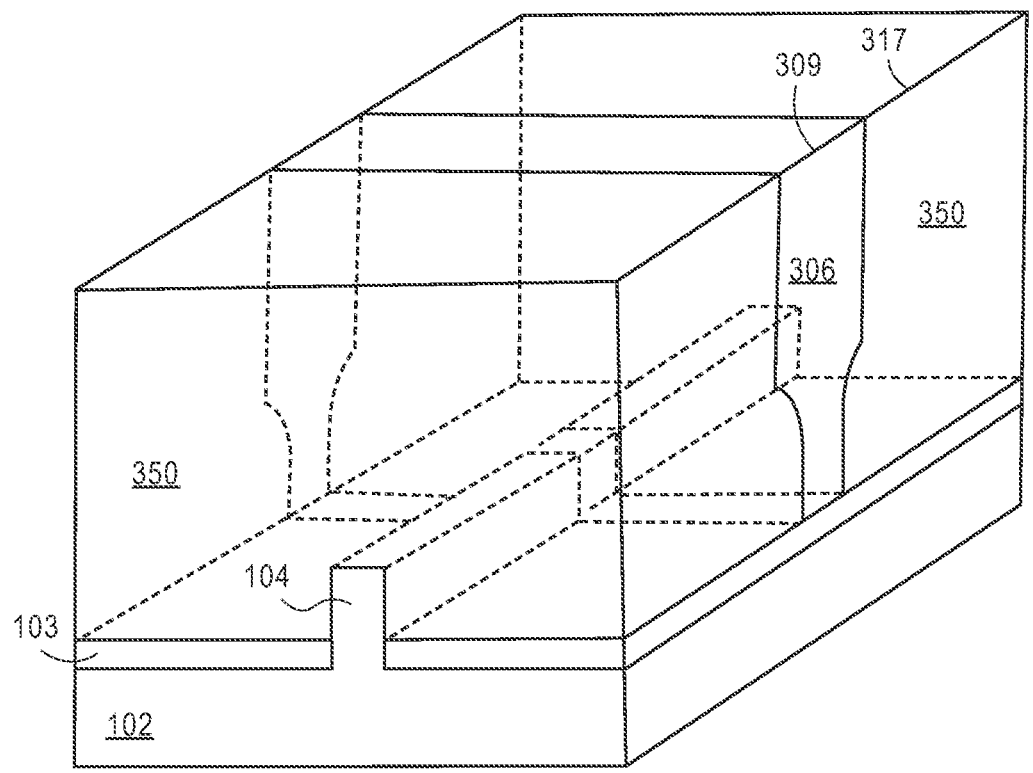
FIGS. 3E-3G illustrate isometric views of a method of forming a gate stack with a fill-friendly profile, in accordance with an embodiment of the invention.

Thereafter, one or more isolation layers 350 may be formed as illustrated in FIG. 3E. In an embodiment, the isolation layer 350 is formed by blanket deposition of an insulating material followed by a planarization process. The blanket deposition may be performed by any suitable deposition process, such as CVD, and subsequently planarized by a planarization process, such as CMP. The CMP process may planarize the insulating material to a top surface 309 of the sacrificial gate structure 306 to expose the sacrificial gate structure 306. In an embodiment, the top surface 309 of the sacrificial gate structure 306 is coplanar with a top surface 317 of the isolation layer 350. The isolation layer 350 may be a low-level isolation layer, such as a first interlayer dielectric (ILD0), in a semiconductor device for electrically isolating source and drain regions 106 and 108 from higher-level routing lines. In an embodiment, the height of gate structure 306 is reduced during the CMP process. In particular, the vertical length 324 of the sacrificial gate structure 306 may be reduced during a planarization process used to planarize the isolation layer 350 and to reveal the gate structure 306. In one such embodiment, such an over planarization process is implemented to accommodate for differing polishing characteristics across a wafer which may arise from the presence of differing device layout densities across the wafer. As such, the height 322 of the sacrificial gate structure 306 may be fabricated to accommodate over planarization processing which reduces the height of the sacrificial gate structure 306 to a height that ultimately corresponds with height 222 of the gate stack described in association with FIG. 2.

The isolation layer 350 may be formed using dielectric materials known for their applicability in integrated circuit structures, such as low-K dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The isolation layer 350 may include pores or air gaps to further reduce their dielectric constant.

Figure 3F:
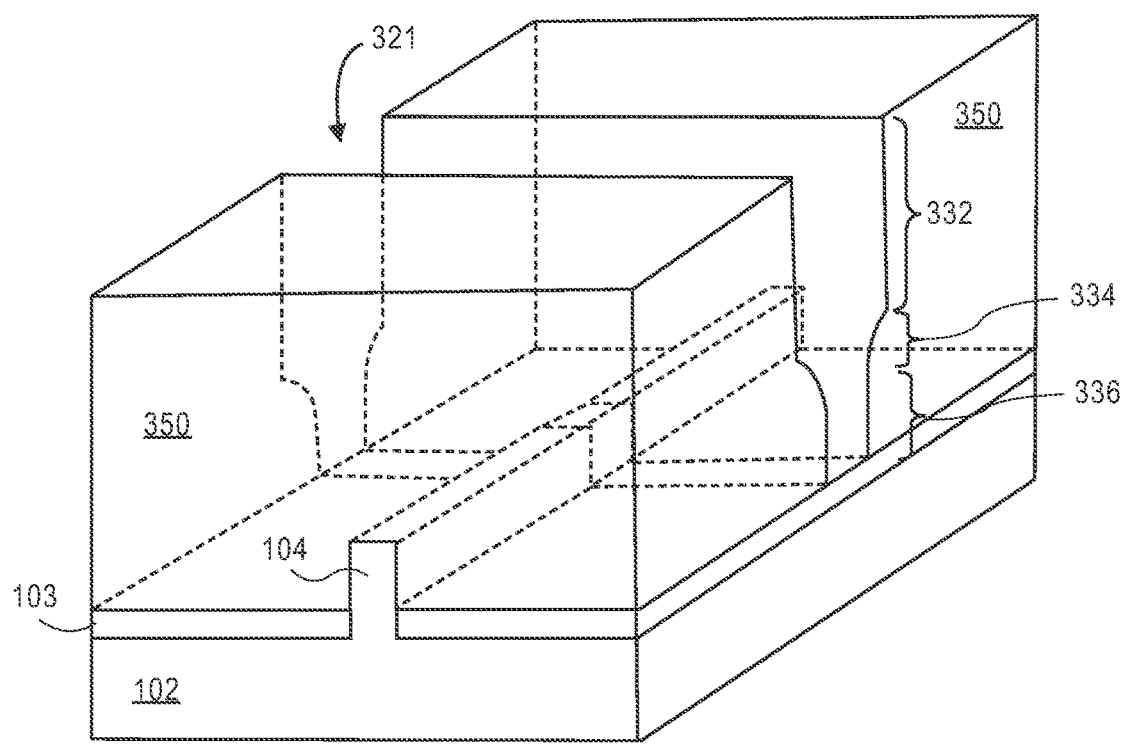

Next, in FIG. 3F, the sacrificial gate structure 306 may be removed by a selective etch process. For instance, a wet etch process that selectively removes the sacrificial gate structure 306 may be used. The selective etch process may substantially remove the sacrificial gate structure 306 while keeping surrounding materials intact. Accordingly, an opening 321 may be formed within the isolation layer 350. The opening 321 may have an opening profile that corresponds with the profile of the sacrificial gate structure 306. Specifically, the opening 321 may have portions that correspond to the portions 324, 326, and 328 of the sacrificial gate structure 306. Thus, the opening 321 may have a wide top portion 332, a tapered portion 334, and a narrow bottom portion 336 that correspond to the portions 324, 326, and 328, respectively, of the sacrificial gate structure 306. It is to be appreciated that, in an embodiment, the vertical length of the wide top portion 332 of the opening 321 can be substantially less than the vertical length of the corresponding portion 324 as a result of an over polishing or over planarization process, as described above.

Figure 3G:
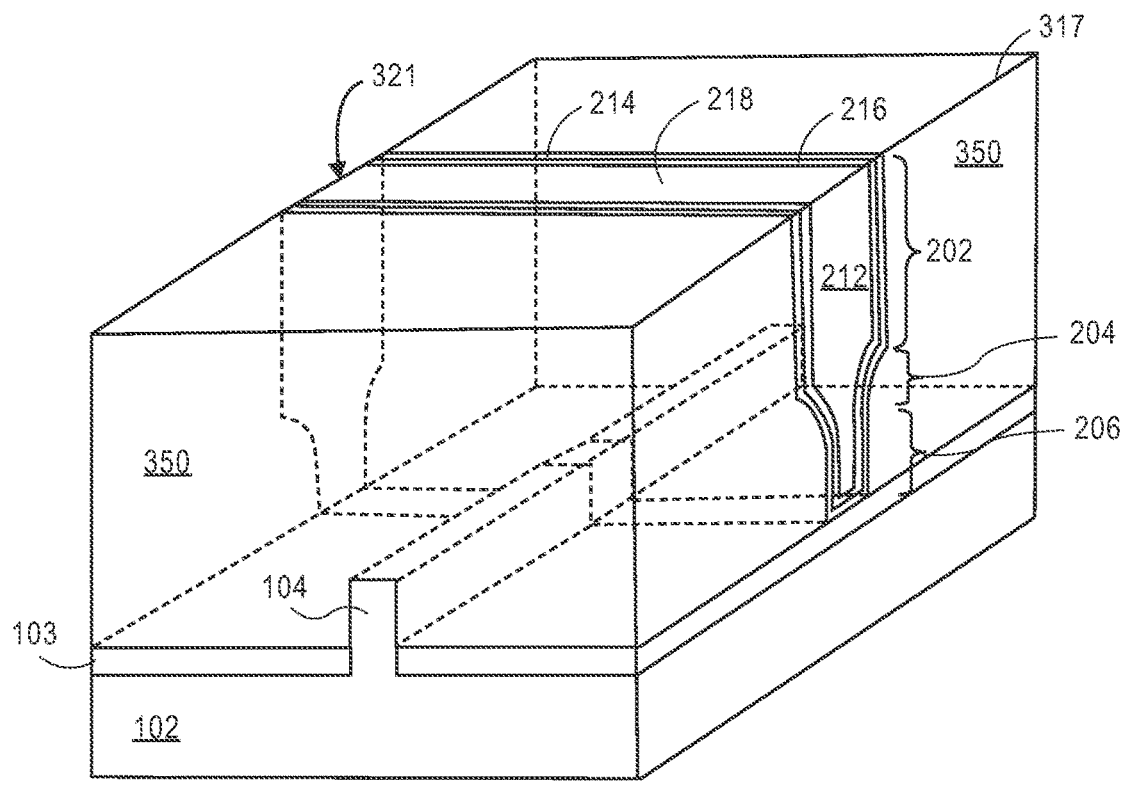

Thereafter, as illustrated in FIG. 3G, a gate stack 212 may be formed the opening 321 to complete formation of the transistor 200. In an embodiment, the gate stack 212 may include a gate dielectric layer 214, a workfunction metal layer 216, and a fill metal layer 218. Dielectric layer 214 may be initially conformally deposited within the opening 321, and the workfunction metal layer 216 and the fill metal 218 may be subsequently deposited over the dielectric layer 214. Any suitable deposition process, such as, but not limited to, sputtering or atomic layer deposition (ALD), may be used to deposit the gate stack 212. A planarization process, such as CMP, may be used to planarize the gate stack 212 to the top surface 317 of the isolation layer 350. The profile of the opening 321 may be highly fill-friendly, which may substantially minimize formation of a void within the gate stack 212, such as the void 124 formed in conventionally-formed gate stacks 112 illustrated in FIG. 1. Specifically, the tapered portion 326 of the opening 321 may allow gate material to be easily deposited within the bottom portion 328. Further, the wide top portion 326 may make it easier for material to deposit without pinching off. Therefore, a void may not be formed within the gate stack 212.

The resulting gate stack 212 may have a gate profile substantially identical to the gate profile discussed herein with respect to FIG. 2. For instance, the gate stack 212 may have a top portion 202, bottom portion 206, and a tapered portion 204. The top, bottom, and tapered portions 202, 206, and 204 of the gate stack 212 may be substantially identical to the top, bottom, and tapered portions 324, 328, and 326 of the sacrificial gate structure 306, respectively. Thus, the discussion regarding the profile of the sacrificial gate structure 306 also applies to the profile of the gate stack 212.

The gate dielectric 214 may include one layer or a stack of layers. The one or more layers may include silicon oxide, silicon dioxide (SiO2) and/or a high-K dielectric material. The high-K dielectric material may include elements such as hafnium, silicon, oxygen, titanium, tantalum, lanthanum, aluminum, zirconium, barium, strontium, yttrium, lead, scandium, niobium, and zinc. Examples of high-K materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric 214 to improve its quality when a high-K material is used. In an embodiment, the gate dielectric 214 is formed of a high-K dielectric material with a dielectric constant of greater than 8.

The workfunction metal 216 may be a P-type workfunction metal or an N-type workfunction metal, depending on whether the transistor 200 is to be a PMOS or an NMOS transistor. In some implementations, the gate electrode of the gate stack 212 may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

Figure 4:
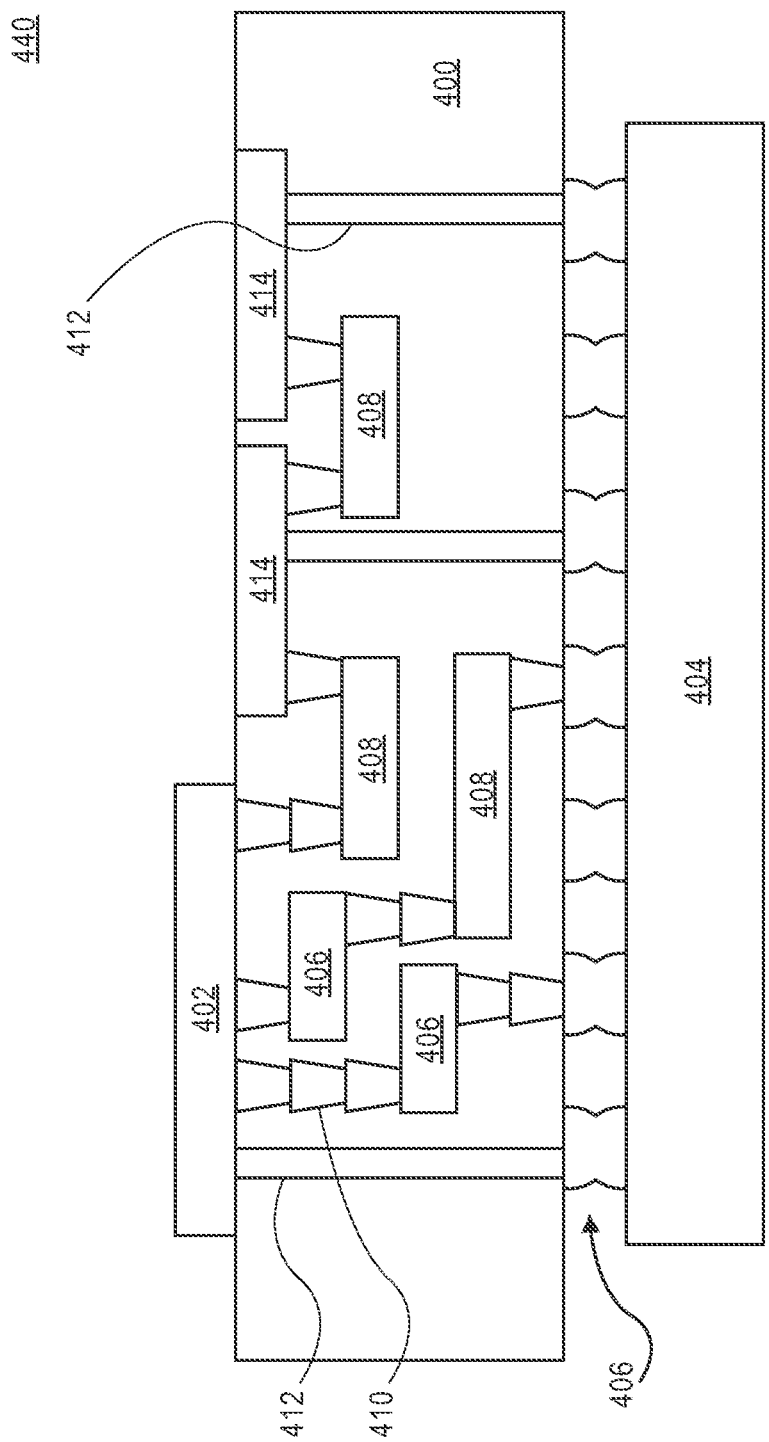
FIG. 4 illustrates an interposer implementing one or more embodiments of the invention.

FIG. 4 illustrates an interposer 400 that includes one or more embodiments of the invention. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400.

In accordance with embodiments of the invention, apparatuses or processes disclosed herein may be used in the fabrication of interposer 400.

Figure 5:
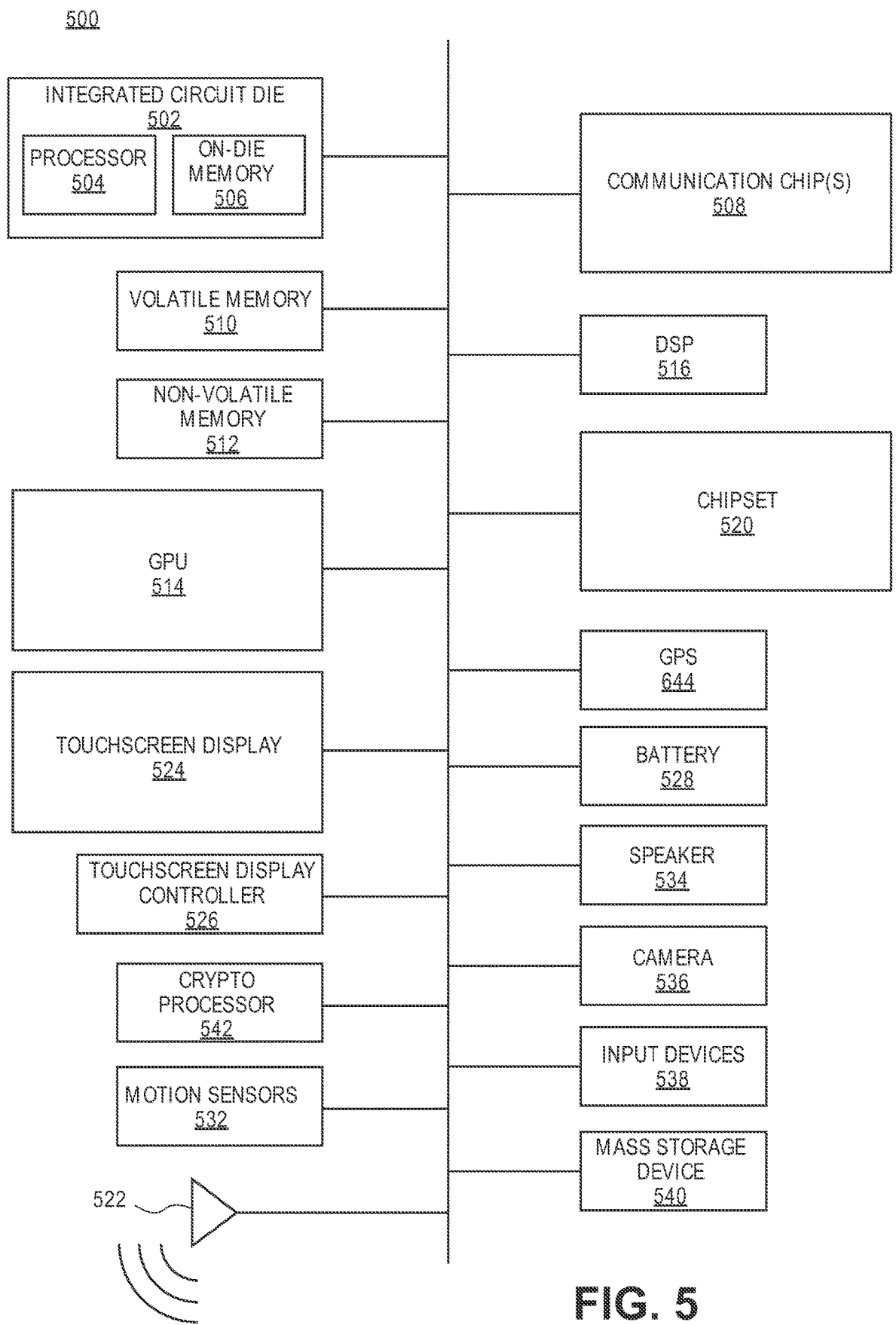
FIG. 5 illustrates a computing device built in accordance with an embodiment of the invention.

FIG. 5 illustrates a computing device 500 in accordance with one embodiment of the invention. The computing device 500 may include a number of components. In one embodiment, these components are attached to one or more motherboards. In an alternate embodiment, these components are fabricated onto a single system-on-a-chip (SoC) die rather than a motherboard. The components in the computing device 500 include, but are not limited to, an integrated circuit die 502 and at least one communication chip 508. In some implementations the communication chip 508 is fabricated as part of the integrated circuit die 502. The integrated circuit die 502 may include a CPU 504 as well as on-die memory 506, often used as cache memory, that can be provided by technologies such as embedded DRAM (eDRAM) or spin-transfer torque memory (STTM or STTM-RAM).

Computing device 500 may include other components that may or may not be physically and electrically coupled to the motherboard or fabricated within an SoC die. These other components include, but are not limited to, volatile memory 510 (e.g., DRAM), non-volatile memory 512 (e.g., ROM or flash memory), a graphics processing unit 514 (GPU), a digital signal processor 516, a crypto processor 542 (a specialized processor that executes cryptographic algorithms within hardware), a chipset 520, an antenna 522, a display or a touchscreen display 524, a touchscreen controller 526, a battery 528 or other power source, a power amplifier (not shown), a global positioning system (GPS) device 528, a compass 530, a motion coprocessor or sensors 532 (that may include an accelerometer, a gyroscope, and a compass), a speaker 534, a camera 536, user input devices 538 (such as a keyboard, mouse, stylus, and touchpad), and a mass storage device 540 (such as hard disk drive, compact disk (CD), digital versatile disk (DVD), and so forth).

The communications chip 508 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 508. For instance, a first communication chip 508 may be dedicated to shorter range wireless communications such as Wi-Fi and Bluetooth and a second communication chip 508 may be dedicated to longer range wireless communications such as GPS, EDGE, GPRS, CDMA, WiMAX, LTE, Ev-DO, and others.

The processor 504 of the computing device 500 includes one or more devices, such as a non-planar transistor, that are formed by a replacement gate process utilizing a sacrificial gate structure with a fill-friendly profile, in accordance with embodiments of the invention. The term "processor" may refer to any device or portion of a device that processes electronic data from registers and/or memory to transform that electronic data into other electronic data that may be stored in registers and/or memory.

The communication chip 508 may also include one or more devices, such as a non-planar transistor, that are formed by a replacement gate process utilizing a sacrificial gate structure with a fill-friendly profile, in accordance with embodiments of the invention.

In further embodiments, another component housed within the computing device 500 may contain one or more devices, such as a non-planar transistor, that are formed by a replacement gate process utilizing a sacrificial gate structure with a fill-friendly profile, in accordance with embodiments of the invention.

In various embodiments, the computing device 500 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. Furthermore, although detailed reference is made to fin-based or non-planar devices, methodologies described herein may also be applicable to planar devices, particularly short channel planar devices fabricated using a replacement gate scheme.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

In an embodiment, a semiconductor device includes a semiconductor substrate and a fin extending above the semiconductor substrate, the fin comprising a source region and a drain region located on opposite sides of a channel region. A gate stack is over the channel region, the gate stack comprising a top portion a tapered portion and a bottom portion wherein the top portion is separated from the bottom portion by the tapered portion, wherein the top portion and at least a portion of the tapered portion are above the fin, and wherein the width of the top portion is greater than the width of the bottom portion.

In one embodiment, the width of the top portion is at least two times greater than the width of the bottom portion.

In one embodiment, the width of the top portion is 40 nm and the width of the bottom portion is 20 nm.

In one embodiment, the tapered portion is above the fin.

In one embodiment, the vertical length of the bottom portion is greater than the height of the fin.

In one embodiment, the top of the tapered portion is at the midpoint of the gate stack height.

In one embodiment, the tapered portion comprises curved sidewalls.

In one embodiment, the curved sidewalls are concave in profile.

In one embodiment, a ratio of gate height to gate length is greater than 5 to 1.

In one embodiment, the ratio of gate height to gate length is 10 to 1.

In one embodiment, the tapered portion is disposed below the midpoint of the gate height and above the fin.

In one embodiment, the widths of the top and bottom portions are constant across the entire height of each respective portion.

In an embodiment, a method of forming a semiconductor device involves providing a semiconductor substrate having a fin extending above the semiconductor substrate. The method also involves forming a sacrificial gate structure over a channel region of the fin with a single etch process comprising a first process operation and a second process operation, the first process operation having a first processing environment and the second process operation having a second processing environment different than the first processing environment. The method also involves depositing dielectric material around the sacrificial gate structure. The method also involves removing the sacrificial gate structure to form an opening within the dielectric material having a corresponding profile of the sacrificial gate profile. The method also involves forming a gate stack within the opening, the gate stack having the same profile as the sacrificial gate structure.

In one embodiment, the first process operation is a main etch operation and the second process operation is an over-etch operation.

In one embodiment, the first processing operation forms the top portion, and the second processing condition forms the tapered portion and the bottom portion.

In one embodiment, the second processing operation is performed immediately after the first processing operation.

In one embodiment, each processing environment comprises a processing temperature and a reactant gas concentration.

In one embodiment, the reactant gas concentration comprises chlorine.

In one embodiment, the first processing environment has a higher reactant gas concentration and a higher processing temperature than that of the second processing condition.

In an embodiment, a computing device includes a motherboard and a processor mounted on the motherboard. A communication chip is fabricated on the same chip as the processor or mounted on the motherboard. The processor includes a semiconductor device including a semiconductor substrate and a fin extending above the semiconductor substrate, the fin comprising a pair of source and drain regions disposed on opposite sides of a channel region. The semiconductor device also includes a gate stack disposed over the channel region, the gate stack comprising a top portion separated from a bottom portion by a tapered portion, wherein the top portion and at least a portion of the tapered portion are disposed above the fin, and wherein the width of the top portion is greater than the width of the bottom portion.

In one embodiment, the width of the top portion is at least two times greater than the width of the bottom portion.

In one embodiment, the tapered portion comprises curved sidewalls.

In one embodiment, the curved sidewalls are concave in profile.

In one embodiment, a ratio of gate height to gate length is greater than 5 to 1.

In one embodiment, the tapered portion is disposed below the midpoint of the gate height and above the fin.

What is claimed is:

1. A semiconductor device, comprising:
a semiconductor substrate;
an isolation structure above the semiconductor substrate, the isolation structure having a top surface;
a fin extending above the semiconductor substrate and above the isolation structure, the fin comprising a source region and drain region located on opposite sides of a channel region, and the channel region of the fin comprising a topmost surface;
a gate stack over the channel region of the fin and over a portion of the isolation structure, wherein the gate stack has a lateral width on a top of the fin less than a lateral width of the gate stack at a top of the gate stack, the gate stack comprising a top portion, a tapered portion and a bottom portion wherein the top portion is separated from the bottom portion by the tapered portion, wherein the top portion and an entirety of the tapered portion and a portion of the bottom portion are above the topmost surface of the channel region of the fin, and wherein a width of the top portion is greater than a width of the bottom portion, wherein the top portion has a lateral width near a center region of the top portion less than a lateral width near a top region of the top portion and less than a lateral width of a bottom region of the top portion, wherein the bottom portion has substantially vertical sidewalls along a direction normal to the top surface of the isolation structure, wherein the top portion has a vertical length greater than a vertical length of the bottom portion, and wherein the bottom portion extends from the top surface of the isolation structure to the tapered portion by a first distance and extends from the topmost surface of the channel region of the fin to the tapered portion by a second distance, the second distance less than the first distance, and wherein the gate stack comprises a gate dielectric along sidewalls of the top portion, the tapered portion and the bottom portion of the gate stack.

2. The semiconductor device of claim 1, wherein the width of the top portion is at least two times greater than the width of the bottom portion.

3. The semiconductor device of claim 2, wherein the width of the top portion is 40 nm and the width of the bottom portion is 20 nm.

4. The semiconductor device of claim 1, wherein the vertical length of the bottom portion is greater than the height of the fin.

5. The semiconductor device of claim 1, wherein the top of the tapered portion is at the midpoint of the gate stack height.

6. The semiconductor device of claim 1, wherein the tapered portion comprises curved sidewalls.

7. The semiconductor device of claim 6, wherein the curved sidewalls are concave in profile.

8. The semiconductor device of claim 1, wherein a ratio of gate height to gate length is greater than 5 to 1.

9. The semiconductor device of claim 8, wherein the ratio of gate height to gate length is 10 to 1.

10. The semiconductor device of claim 1, wherein the tapered portion is disposed below the midpoint of the gate height and above the fin.

11. The semiconductor device of claim 1, wherein the widths of the top and bottom portions are constant across the entire height of each respective portion.

12. A computing device, comprising:
a motherboard;
a processor mounted on the motherboard; and
a communication chip fabricated on the same chip as the processor or mounted on the motherboard;
wherein the processor comprises a semiconductor device comprising:
a semiconductor substrate;
an isolation structure above the semiconductor substrate, the isolation structure having a top surface;
a fin extending above the semiconductor substrate and above the isolation structure, the fin comprising a pair of source and drain regions disposed on opposite sides of a channel region, and the channel region of the fin comprising a topmost surface;
a gate stack over the channel region of the fin and over a portion of the isolation structure, wherein the gate stack has a lateral width on a top of the fin less than a lateral width of the gate stack at a top of the gate stack, the gate stack comprising a top portion, a tapered portion and a bottom portion wherein the top portion is separated from the bottom portion by the tapered portion, wherein the top portion and an entirety of the tapered portion and a portion of the bottom portion are above the topmost surface of the channel region of the fin, and wherein a width of the top portion is greater than a width of the bottom portion, wherein the top portion has a lateral width near a center region of the top portion less than a lateral width near a top region of the top portion and less than a lateral width of a bottom region of the top portion, wherein the bottom portion has substantially vertical sidewalls along a direction normal to the top surface of the isolation structure, wherein the top portion has a vertical length greater than a vertical length of the bottom portion, and wherein the bottom portion extends from the top surface of the isolation structure to the tapered portion by a first distance and extends from the topmost surface of the channel region of the fin to the tapered portion by a second distance, the second distance less than the first distance, and wherein the gate stack comprises a gate dielectric along sidewalls of the top portion, the tapered portion and the bottom portion of the gate stack.

13. The semiconductor device of claim 12, wherein the width of the top portion is at least two times greater than the width of the bottom portion.

14. The semiconductor device of claim 12, wherein the tapered portion comprises curved sidewalls.

15. The semiconductor device of claim 12, wherein the curved sidewalls are concave in profile.

16. The semiconductor device of claim 12, wherein a ratio of gate height to gate length is greater than 5 to 1.

17. The semiconductor device of claim 12, wherein the tapered portion is disposed below the midpoint of the gate height and above the fin.

* * * * *